United States Patent [19]

Merrick et al.

[11] Patent Number: 4,980,568
[45] Date of Patent: Dec. 25, 1990

[54] OPTICAL ISOLATOR HAVING HIGH VOLTAGE ISOLATION AND HIGH LIGHT FLUX LIGHT GUIDE

[75] Inventors: Stephen P. Merrick, San Jose; Joseph Pernyeszi, Scotts Valley, both of Calif.

[73] Assignee: Hewlett-Packard Company, Palo Alto, Calif.

[21] Appl. No.: 355,443

[22] Filed: May 22, 1989

[51] Int. Cl.⁵ ............................................. G02B 27/00
[52] U.S. Cl. ...................................... 250/551; 357/19
[58] Field of Search .................... 250/239, 227, 551; 357/17, 19, 30; 307/311

[56] References Cited

U.S. PATENT DOCUMENTS

| | | | |
|---|---|---|---|
| 4,054,801 | 10/1977 | Breval et al. | 250/551 |
| 4,160,308 | 7/1979 | Courtney et al. | 357/19 |
| 4,237,382 | 12/1980 | Thillays | 250/551 |
| 4,284,898 | 8/1981 | Felkel et al. | 357/19 |
| 4,446,375 | 5/1984 | Aird | 357/19 |
| 4,450,461 | 5/1984 | Cook et al. | 357/19 |
| 4,633,582 | 1/1987 | Ching et al. | 357/19 |
| 4,694,183 | 9/1987 | Merrick et al. | 357/19 |
| 4,712,017 | 12/1987 | Kamasaki | 357/19 |
| 4,745,294 | 5/1988 | Kohashi et al. | 250/551 |
| 4,796,084 | 1/1989 | Kamasaki et al. | 357/19 |

Primary Examiner—David C. Nelms
Assistant Examiner—Stephone B. Allen

[57] ABSTRACT

A high voltage optical isolator has a light emitting diode which illuminates a photodetector for conveying a signal by optical means while isolating the input voltage from the output. The LED is spaced from the photodetector by an extension on an opaque reflective light guide around the optical path between the LED and photodetector. The light guide has a transparent silicone resin medium in a light passage between the LED and photodetector. The internal and external portions of the light guide provide elongated crooked paths for enhancing electrical breakdown resistance. The entire optical isolator is packaged in a conventional DIP. Isolation voltages of 5,000 volts or more and enhancement of light flux coupling up to 300% are obtained.

25 Claims, 5 Drawing Sheets

OPTICAL ISOLATOR HAVING HIGH VOLTAGE ISOLATION AND HIGH LIGHT FLUX LIGHT GUIDE

FIELD OF THE INVENTION

This invention relates to an optical isolator wherein a light emitting diode and photodetector are used for transmitting a signal optically while isolating the input voltage from the output. Techniques are provided for assuring high isolation voltage and high light flux.

BACKGROUND OF THE INVENTION

An optical isolator, sometimes referred to as an optical coupler, may be used in an electrical circuit to allow signal propagation in a forward direction while maintaining voltage and current isolation between the input and the output of the optical isolator. Such an isolator includes a light emitting diode (LED) at the input, a photodetector at the output and an optically transmissive, high breakdown-voltage isolation gap separating the LED and the photodetector. For optimum performance, reliability and reproducibility, the geometry and materials must be maintained accurately and reproducibly during manufacture.

It is also important for obtaining high signal strength to provide a high degree of light transmission between the input and output. It is desirable to have an efficient LED with high light output as a function of current. It is also desirable to have a sensitive photodetector with a large photodetection area to capture as much light as possible. Of considerable significance, however, is minimizing loss of light emitted by the LED before the light reaches the photodetector.

Another important consideration in a optical isolator is the degree of isolation of the input voltage from the output. Until recently isolation voltages of up to about 2,500 volts have been acceptable. In some applications, performance requirements seek electrical isolation of 5,000 volts or more. The physical dimensions of the parts are extremely small so excellent electrical breakdown resistance must be provided to maintain such voltage isolation.

It is convenient to provide an optical isolator as a separate component which can be employed in a variety of circuit applications. Thus, such components are conveniently provided in dual in-line packages or DIPs where the device is encapsulated in a molding compound with a row of electrical leads along each edge so that the DIP can be attached to a printed circuit board or the like. U.S. Pat. No. 4,694,183 by Merrick, et al., describes such a DIP and its manufacturing technique.

In such an embodiment the optical isolator is fabricated on an almost flat metal lead frame. A portion of the lead frame is "folded" to place the LED opposite the photodetector. An optically transmissive silicone gel is placed between the LED and photodetector to keep a clear optical path therebetween. This assembly is then encapsulated in conventional opaque transfer molding material and the metal leads are trimmed and bent to complete the DIP.

Surface emitting LEDs have been used in such an embodiment. Light is emitted from a surface of an LED which is aligned with the photoreceptive surface of the photodetector. However, it is desirable to employ an isotropic emitting LED which emits light in all directions so that a larger light flux may be obtained from a smaller device. As much as 40% of the light from an isotropic LED is emitted from the sides and in an arrangement as provided in U.S. Pat. No. 4,694,183, much of that light is lost from the silicone gel into the surrounding molding compound.

The amount of light transmitted from an isotropic LED toward the photodiode may be increased about 30% (as measured by the photodiode current) by forming a shallow reflective cup in the metal lead on which the LED is placed. Thus, light emitted laterally from the LED is reflected in the direction of the photodetector. It is desirable to enhance the amount of light transmitted from the LED to the photodetector even more. In practice of this invention, the total light flux has been increased to 300% of the light flux without this invention.

It appears that electrical breakdown and arcing between the input and output occurs along interfaces between materials, particularly when the interface is not well bonded. Thus, for example, there may be poor bonding between the transfer molding material used for encapsulating the DIP and the silicone used to provide a clear light path between the LED and photodetector. Silicone resins have the property of wetting most surfaces quite well before curing, but after curing they become resistant to wetting by other materials. Since the transfer molding material does not wet the silicone well, poor bond strength is obtained, leaving an electrically weak path along which electrical breakdown and arcing may occur. It is therefore desirable to provide a means for assuring good bonding and high resistance to electrical breakdown. Isolation voltages in excess of 5000 volts are obtained in practice of this invention.

BRIEF SUMMARY OF THE INVENTION

There is, therefore, provided in practice of this invention according to a presently preferred embodiment, an optical isolator comprising a light emitting diode mounted on a first lead, and a photodetector mounted on a second lead and spaced apart from the light emitting diode for receiving illumination therefrom. A reflective, opaque insulating conduit is provided between the light emitting diode and the photodetector containing a transparent insulating medium. This entire assembly may be embedded in an opaque insulating molding material.

Preferably, the exterior of the conduit has a crooked surface for forming an electrical breakdown path length greater than the distance between the electrical leads and for assuring that a major portion of the exterior of the conduit is wetted by the molding material for enhancing electrical breakdown resistance of the optical isolator.

BRIEF DESCRIPTION OF THE DRAWINGS

These and other features and advantages of the present invention will be appreciated as the same becomes better understood by reference to the following detailed description when considered in connection with the accompanying drawings, wherein.

DETAILED DESCRIPTION

Figure 1:
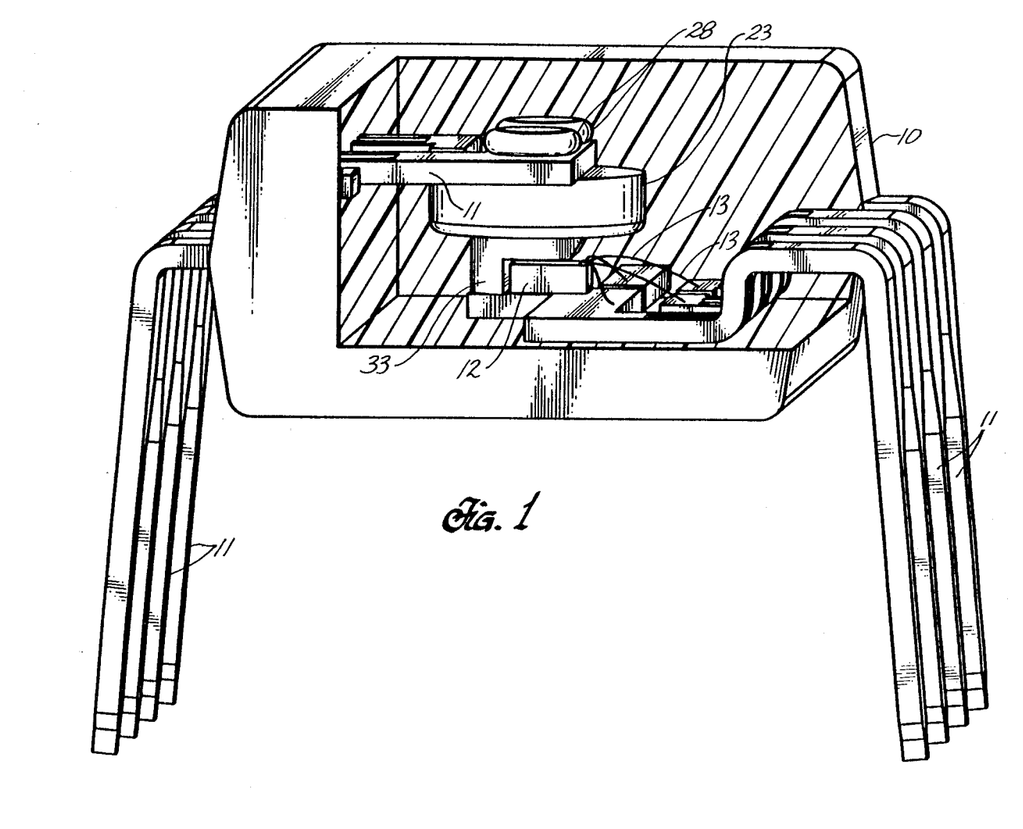
FIG. 1 illustrates a partially cut away isometric view of a dual in-line package containing an optical isolator constructed according to principles of this invention.
Figure 2:
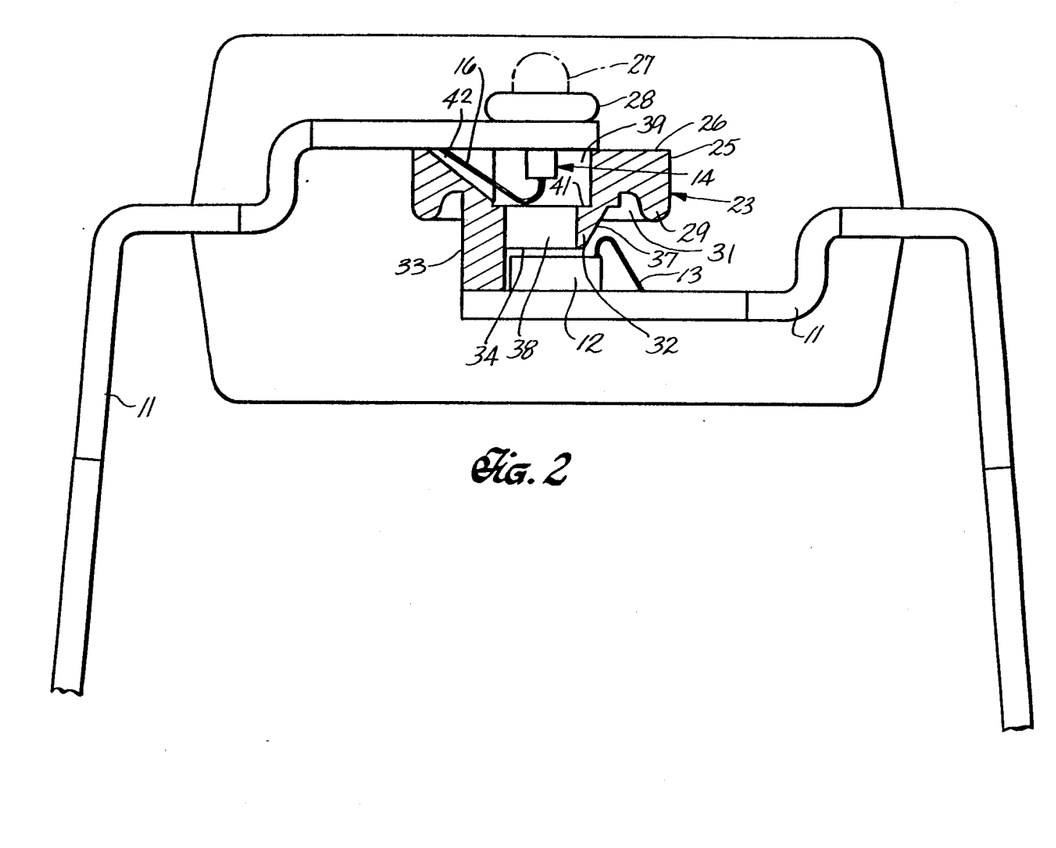
FIG. 2 is a partial transverse cross-section of such a dual in-line package.

An exemplary dual in-line package (DIP) in which an optical isolator is assembled comprises an insulating body 10, which is typically made of a moisture resistant opaque, cured epoxy transfer molding material. A row of electrical leads 11 extend laterally from each edge of the body and downwardly for connection to a printed circuit board or the like. It will be recognized that such a DIP is merely exemplary of packaging that may be employed for an optical isolator. Leadless chip carriers and other conventional packages may also be employed.

It will also be apparent that "top," "bottom," "up," "down" and the like are used herein for purposes of exposition for an understanding of this invention. Orientation of the device is not material and these conventions are employed only for convenience.

A semiconductor photodetector 12 such as a photodiode is mounted on the one of the electrical leads within the body. Bond wires 13 are used in a conventional manner to make electrical connections between the photodetector and other electrical leads or to integrated circuits contained within the DIP. Details of the photodetector and its connections are not material to an understanding of this invention.

A light emitting diode (LED) 14 is mounted on another of the electrical leads inside the body of the DIP. In this embodiment, the LED is mounted on one of the upper electrical leads in the DIP and the photodetector is mounted on one of the lower leads. These could, of course, be reversed. Bond wires 16 make electrical connections between the LED and electrical leads integrated circuits within the DIP for applying a signal to the LED.

In an exemplary embodiment, a conventional indium-gallium-arsenide-phosphide or gallium-arsenide-phosphide LED may be employed, suitably doped to emit radiation in a characteristic wavelength band suitable for high efficiency detection by the photodetector. The radiation band for the LED may be at any convenient wavelength in the visible or infrared spectra out to about one micrometer. In an exemplary embodiment, the LED is in the form of a 250 micron cube which emits radiation isotropically. Details of the LED and its connections are not material to an understanding of this invention.

Figure 3:
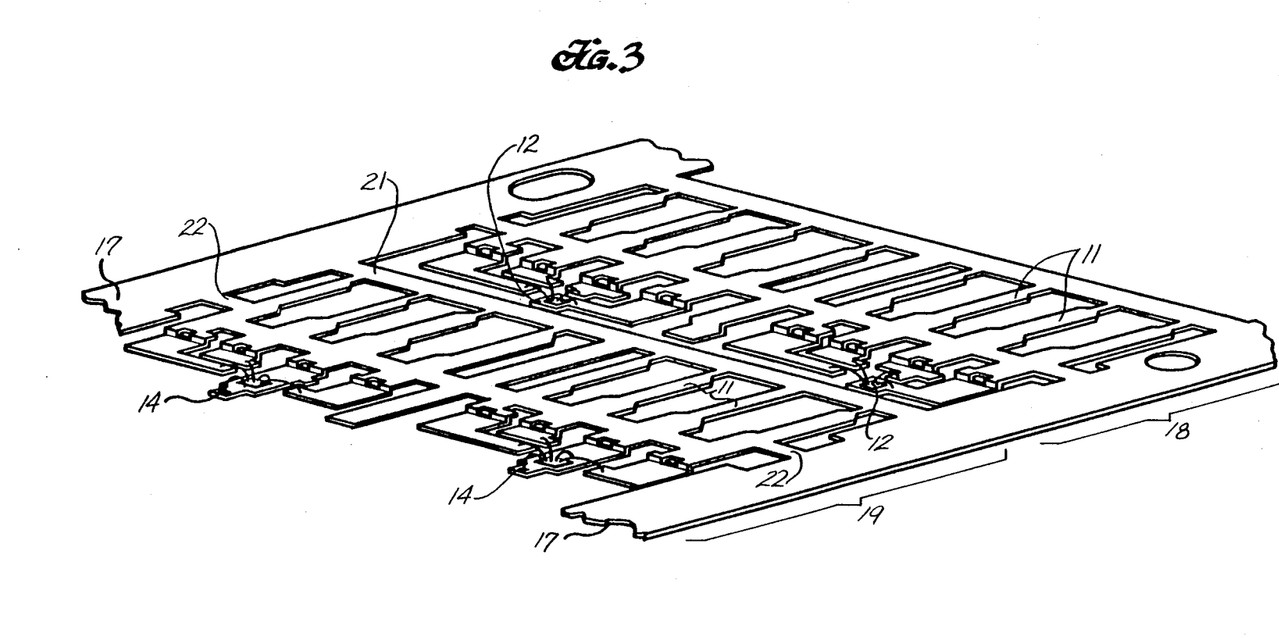
FIG. 3 is an isometric view of an exemplary lead frame employed in fabricating such a dual in-line package at an intermediate stage of manufacture.
Figure 4:
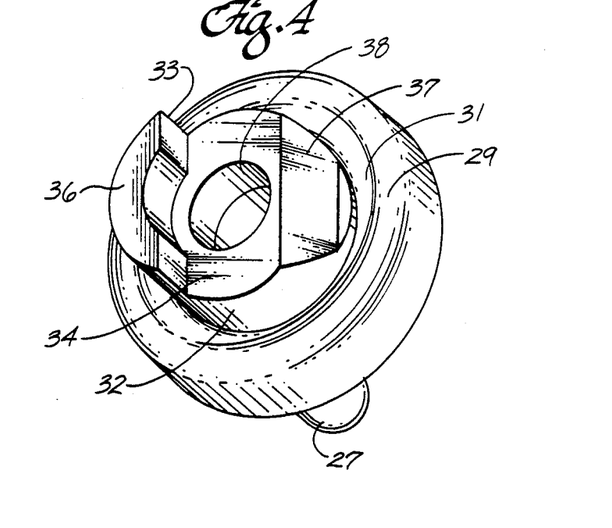
FIG. 4 is an isometric view of an exemplary light guide employed in the optical isolator.
Figure 5:
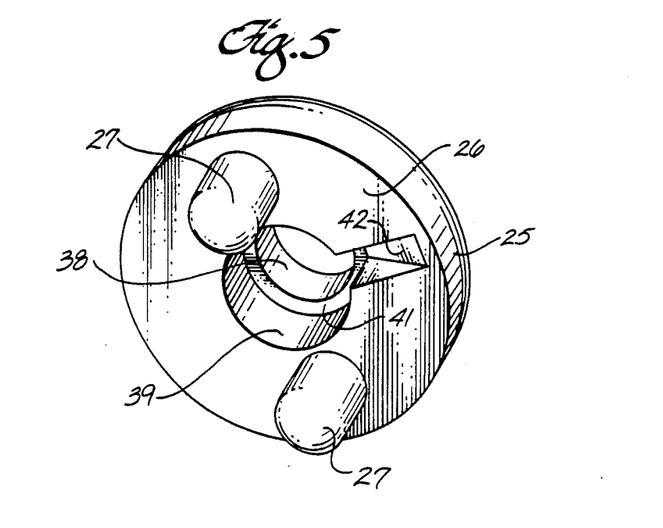
FIG. 5 is another isometric view of the exemplary light guide of FIG. 4.
Figure 6:
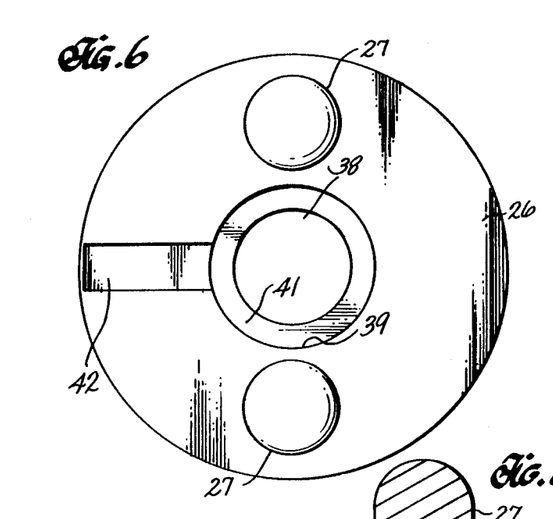
FIG. 6 is a top plan view of the light guide of FIG. 4.
Figure 7:
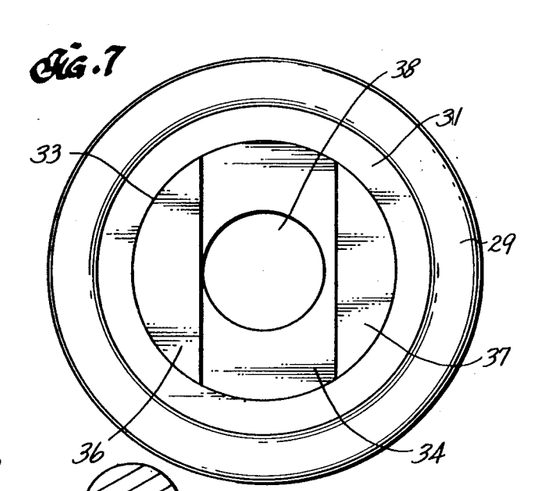
FIG. 7 is a bottom plan view of the light guide of FIG. 4.

FIG. 3 illustrates an exemplary lead frame for use in manufacturing DIPs suitable for an optical isolator as provided in practice of this invention. A more complete description of such a lead frame and an exemplary manufacturing technique is set forth in U.S. Pat. No. 4,694,183. The lead frame comprises a pair of side rails 17 which may carry between them the electrical leads and supporting structure for making a plurality of DIPs in automated machinery. The portion of the lead frame illustrated in FIG. 3 is sufficient for making a pair of conventional eight-lead DIPs side by side. Several such pairs may be provided along the length of the side rails.

One segment 18 of the lead frame provides the lower electrical leads for a pair of DIPs and an adjacent segment 19 provides the upper electrical leads for a pair of DIPs.

For each such DIP a photodetector die 12 is fixed on one electrical lead in the bottom lead segment 18. Similarly, an LED 14 is secured on an electrical lead in the upper lead segment 19. After wire bonding to make electrical connections to the photodetector and LED, the ends of a tie bar 21 are sheared from the side rails and the array of leads in the upper segment 19 is rotated 180° by twisting hinge "pins" 22 connecting the array of leads to the side rails. This rotation (not illustrated herein) brings each LED to a carefully aligned position over the top of the corresponding photodetector die. As described in the '183 patent, this brings the LED into good alignment with the photodetector.

The manufacturing technique for this invention differs from that described in the '183 patent in that before rotating the segment containing the LED, a light guide 23 (not shown in FIG. 3) is placed over or around the LED. A preferred light guide is illustrated apart from the other structure of the optical isolator in FIGS. 4 to 8. As illustrated therein, the light guide comprises a circular base or flange 25 which is flat on its top face 26, that is, the face that is mounted against the lead 11 supporting the LED. A pair of posts 27 extend from the flat face of the base. The light guide is assembled to the lead supporting the LED by passing the posts through holes (not shown) in the lead and then heat staking or upsetting the ends of the posts to form a bead 28 which secures the light guide and lead together.

On its opposite face, the base has a circumferentially extending raised rim 29 around its perimeter. The rim is smoothly rounded and blends into an annular basin 31 inside the rim. In the center of the basin there is a generally circular body 32 extending in the opposite direction from the mounting posts 27. One side portion of the body forms an extension 33 beyond a plane 34 forming the end of the principal portion of the body. The end 36 of the extension 33 is parallel to the flat face 26 of the base, and when the segment of upper leads is rotated to position over the lower leads, it rests against the lower lead, thereby providing a fixed spacing between the upper and lower leads. To give an idea of scale, the height of the extension above the flat face of the base in an exemplary embodiment is 1.32 mm. The diameter of the base in such an embodiment is 2.29 mm.

The plane 34 defines an end to the principal portion of the body so that there is a close spacing between the end of the body and a photodetector 12 beneath the light guide. Only a small gap is desirable between the light guide and photodetector for minimizing light loss and enhancing bonding to the molding material forming the body of the DIP. A gap as small as 75 micrometers or less is desirable. By terminating a principal portion of the body at the end plane 34, leaving only a sector of the cylindrical body as the extension 33, there can be appreciable flexibility in the choice of photodetector used with the light guide. A substantial portion of the photodetector may extend well beyond the body of the light guide for making electrical connections or the like. One side of the body is preferably chamfered by a diagonal face 37 to provide clearance for the bond wires attached to a photodetector.

Figure 8:
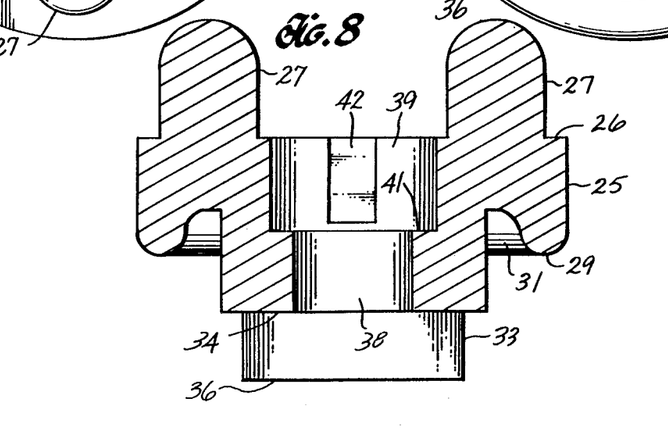
FIG. 8 is a transverse cross-section through the light guide of FIG. 4.

A generally cylindrical light passage extends through the light guide. A lower portion 38 of the light passage, that is the portion nearer the photodiode, has a relatively smaller diameter and an upper portion 39 of the passage around the light emitting diode has a relatively larger diameter so that there is a step or shoulder 41 part way along the length of the light passage. A diagonally extending slit 42 between the flat face of the base and the larger diameter portion of the light passage provides clearance for lead wires to the LED.

After the light guide is staked securely to the lead and before the upper leads are rotated completely into position over the photodetector, the passage through the light guide is slightly more than completely filled with an uncured silicone resin. In an exemplary embodiment, the amount of resin added is only about 0.56 microliters.

When the light guide is then placed over the photodetector, the silicone wets not only the interior of the light guide, but also the face of the photodetector. A narrow meniscus of silicone forms in the gap between the face of the photodetector and the plane 34 forming the end of the light guide.

Because of the extension 33, the light guide provides controlled spacing between the upper and lower leads. This, in combination with the known volume of the light passage, assures a fixed cavity volume so that a controlled amount of silicone resin may be added for complete filling. By carefully controlling the quantity of silicone resin placed in the passage, wetting of other surfaces of the light guide can be minimized. In the event of excess resin being added, the annular basin 31 surrounding the body of the light guide serves to catch overflow.

A preferred silicone resin comprises McGhan NuSil CV-8151, available from McGhan NuSil Incorporated, Carpenteria, Calif. Another suitable resin may be Ql-4939 available from Dow Corning Corporation, Midland, Mich. Each of these resins cures to form a viscous gel. It is important that the medium filling the light passage be highly transparent in the wavelength band of the optical isolator. It should also have high dielectric strength, be substantially free of bubbles, and wet the surfaces of the LED, light passage and photodetector. It should also be stable at the curing temperature of the molding material forming the body of the DIP.

After the silicone resin has been cured, the body of the DIP is transfer molded by conventional techniques. An opaque insulating epoxy molding compound is typically transfer molded at about 70 kg per square centimeter. This has the incidental benefit of diminishing the size of any bubbles present in the silicone. It is important to have the optical path between the LED and photodetector filled with a transparent material; otherwise, the molding compound would intrude into the cavity and occult the photodetector. The epoxy is cured at elevated temperature, for example, 175° to 200° C. The leads can then be trimmed and bent to complete the DIP.

The light guide is injection molded from high-temperature thermoplastic transparent, polyethersulfone resin such as Vitrex PES, available from Imperial Chemical Industries, Ltd, London, England. The polyethersulfone resin is loaded with 12% by weight of titanium dioxide pigment. Polyethersulfone is desirable since it has high dielectric strength, a linear coefficient of expansion similar to that of the epoxy transfer molding compound forming the body of the DIP, and a softening temperature greater than 200° C.

The manufacturing technique can be summarized as follows:
Prepare the lead frame strips.
Attach the LED and photodetector to each of the appropriate leads.
Wire bond electrical leads to the LED and photodetector die.
Attach the light guide to the lead having the LED.
Prebake the entire assembly at 175° C. for two hours.
Inject silicone resin into the light passage.
Rotate the upper leads over the lower leads and press to secure in position.
Cure the silicone for two hours at 95° C. (for example).
Mold the lead frames with attached components.
Trim and form the leads.

The light guide serves a number of functions. As suggested by the name given it herein, it serves to enhance the light flux from the LED which reaches the photodetector. This is not truly a "light guide" as one might think of it for fiber optics where there are differences in index of refraction to avoid loss of light from the sides of a guide. In some respects it is more like a reflective cavity and yet it differs from that as well.

The actual mechanism for assuring excellent light transmission is not specular reflection, but rather it involves multiple scattering reflections in a closed cavity. This occurs since the polyethersulfone resin is transparent and light is reflected from the white titanium dioxide pigment. There is multiple scattering of light from the pigment which has a reflectivity of more than 85%. Because of this there is a large amount of scattering of light within the closed system with very little absorption. Penetration depth of light in the titanium dioxide loaded polyethersulfone is less than 500 micrometers. Thus, the wall thickness of the light guide should be greater than 500 micrometers to avoid loss of light. In one exemplary structure, it appears that light losses into the plastic are less than about 10%.

Metallic pigment in the resin might be more reflective, but such material is inappropriate because of the low conductivity required in the light guide to prevent electrical breakdown.

Some light is lost because of the step within the light passage, but this appears to be minor. The principal light loss appears to be due to light incident on the slit 42 which provides clearance for the LED lead wires. Reflections from the sloping wall leading away from the photodetector inefficiently return light to the principal light passage.

Another important function of the light guide is to enhance the isolation voltage between the input and output. Several features of the light guide contribute to enhancing the electrical breakdown resistance.

The light guide confines the silicone resin largely within the light passage so that wetting by the resin of other surfaces is minimized. This tends to minimize the presence of an "interlayer" of silicone resin in the interface between other structure and the insulating molding material forming the body of the DIP. Thus, only a narrow band at the gap adjacent to the photodetector is unwetted by the molding material. If any silicone does escape from the light passage it may be on a wall of the body or at most in the recessed basin 31 surrounding the body.

The enlarged base 25 extending outwardly from the body of the light guide forms an insulating flange which increases the possible arc path along the surface of the light guide to a length significantly more the spacing between the upper and lower leads. It is observed that electrical breakdown commonly occurs along an interface such as along the surface of the light guide. By enlarging the path length along the surface of the light guide, higher breakdown voltages can be achieved. The somewhat crooked path along the outside surface of the light guide is more than the path length directly between the leads.

The raised rounded peripheral rim 29 around the base contributes to forming an elongated crooked path along the surface of the light guide. In addition, it provides a surface which is approximately perpendicular to the electric field in the dielectric material between the conductive leads. This, too, enhances the resistance to electrical breakdown. The step or shoulder 41 in the light passage also provides a surface perpendicular to the electric field. As will be apparent, it also enlarges the path length along the interface between the polyethersulfone light guide and the silicone transparent medium within the light passage.

Such features enable an optical isolator constructed according to principles of this invention to have an input-to-output isolation voltage of 5000 volts or more. Electrical breakdown voltage of as much as 12,000 volts may be obtained even though the spacing between the LED and the photodetector is as little as one-half millimeter.

In an alternative embodiment, the entire assembly of light guide, transparent medium and molding material may be based on polyamide resins for even larger breakdown voltage resistance. Polyamide resins have very high inherent dielectric strength and are transparent in the wavelength bands of interest. Further, by making the entire assembly of similar resin, breakdown resistance along interfaces is enhanced. In such an embodiment, the light guide may be formed of a transparent polyamide resin loaded with a white reflective pigment such as titanium dioxide. The resin may be only partly cured to a "B-stage" rather than completely cross-linked. Such a partly cured light guide may be secured to the electrical lead by heat deformation.

The light passage is then filled with a transparent resin and the entire assembly embedded in a resin loaded with pigment to make it opaque. The resin within the light passage need not be cured before the final molding material is cured. Liquid polyamide resin bonds well to partially cured light guide material to make an integral package of polyamide material with very high electrical breakdown resistance. Less attention needs to be directed to making crooked arc path lengths along the surfaces of the light guide in such an embodiment.

Although limited embodiments of optical isolator have been described and illustrated herein, many modifications and variations will be apparent to those skilled in the art. Thus, for example, a single optical isolator is provided in the DIP illustrated herein. If desired, more than one such optical isolator may be included in a single integrated circuit package. It will also be apparent that additional circuitry on integrated circuit chips, particularly for processing of the photodiode signal, may be included in the package.

The light guide may, in effect, be reversed so that a photodetector is in a larger diameter portion of the light passage and an LED is in the smaller diameter portion. This should result in slightly less light loss due to the step in the passage. It will be noted that it is immaterial whether the enlarged flange is adjacent to the photodetector lead or the LED lead. Voltage differences are all that are of concern. Further, the signals applied in many applications are alternating current.

If desired, the features of the light guide provided in practice of this invention may be combined with mounting of an LED in an indented cup for further reflecting light toward the photodetector. The benefit from this is considered to be limited, however, since a very large improvement in light flux conveyed is obtained with the light guide as compared with the cup. Light losses in the slit for the LED lead wires may, however, be reduced.

Many other modifications and variations will be apparent to those skilled in the art and it therefore is to be understood that within the scope of the appended claims the invention may be practiced otherwise than as specifically described.

What is claimed is:

1. An optical isolator comprising:
   a light emitting diode mounted on a first electrical lead;
   a photodetector mounted on a second electrical lead and spaced apart from the light emitting diode in sufficient alignment with the light emitting diode for receiving illumination therefrom;
   a reflective opaque insulating cavity between the light emitting diode and the photodetector; and
   a transparent insulating medium within the cavity; and
   an opaque insulating molding material surrounding the cavity.

2. An optical isolator as recited in claim 1 wherein the cavity has a circular transverse cross section.

3. An optical isolator as recited in claim 1 wherein the cavity comprises a white pigment suspended in a transparent synthetic resin.

4. An optical isolator as recited in claim 3 wherein the pigment comprises titanium dioxide.

5. An optical isolator as recited in claim 4 wherein the synthetic resin comprises thermoplastic polyethersulfone.

6. An optical isolator as recited in claim 1 wherein the transparent medium comprises a cured gel-like silicone resin.

7. An optical isolator as recited in claim 1 further comprising a means on the cavity for spacing the electrical leads apart a selected distance.

8. An optical isolator as recited in claim 1 wherein the walls of the cavity are parallel to the optical axis between the light emitting diode and the photodetector.

9. An optical isolator as recited in claim 1 wherein internal and external surfaces of the cavity are sufficiently crooked that the path length along any surface between the first and second electrical leads is greater than the distance between the electrical leads.

10. An optical isolator as recited in claim 9 wherein the internal surface of the cavity comprises a step between the first electrical lead and the second electrical lead.

11. An optical isolator as recited in claim 9 wherein the external surface of the cavity comprises a radially extending flange.

12. An optical isolator as recited in claim 11 wherein the flange includes a raised curved rim.

13. An optical isolator comprising:
    a light emitting diode on a first conductive lead;
    a photodetector on a second conductive lead;
    an insulating light guide around the light path between the LED and the photodetector, the light guide having a crooked exterior surface, at least a portion of the exterior surface being approximately perpendicular to the electric field between the first and second leads; and a transparent medium surrounding the light emitting diode and extending to the photodetector.

14. An optical isolator as recited in claim 13 wherein the external surface of the light guide comprises a radially extending flange.

15. An optical isolator as recited in claim 14 wherein the flange includes a raised curved rim.

16. An optical isolator comprising:
a light emitting diode on a first conductive lead;
a photodetector on a second conductive lead;
an insulating light guide around the light path between the LED and the photodetector, the light guide having a crooked surface, at least a portion of the interior surface is approximately perpendicular to the electric field between the first and second leads; and
a transparent medium surrounding the light emitting diode and extending to the photodetector.

17. An optical isolator as recited in claim 16 wherein the internal surface of the light guide comprises a step between the first lead and the second lead.

18. An optical isolator comprising:
an isotropic light emitting diode;
a photodetector for receiving illumination from the light emitting diode;
a light passage between the light emitting diode and the photodetector filled with a transparent gel-like resin; and
walls of the light passage extending substantially all the way from the light emitting diode to the photodetector comprising a transparent resin containing a reflective nonmetallic pigment for scattering light.

19. An optical isolator as recited in claim 18 wherein the pigment comprises titanium dioxide.

20. An optical isolator as recited in claim 18 wherein the synthetic resin forming the light passage comprises thermoplastic polyethersulfone.

21. An optical isolator as recited in claim 18 wherein the walls of the light passage are parallel to the optical axis between the light emitting diode and the photodetector.

22. An optical isolator as recited in claim 18 wherein internal and external surfaces of the light passage are crooked.

23. An insulating light guide for an optical isolator comprising:
a circular flange;
at least one post extending from the flange for connecting the light guide to an electrical lead;
a generally circular body extending from the flange in the opposite direction from the post and having a smaller diameter than the flange;
an extension extending from the body and having a face parallel to the flange for bearing against a second electrical lead;
a generally cylindrical light passage extending through the body coaxial with the body; and
a step in the light passage so that a path length along the surface of the light passage is greater than the length of the light passage.

24. A light guide as recited in claim 23 comprising a circumferentially extending raised rim around the perimeter of the flange on the same side of the flange as the body.

25. A light guide as recited in claim 23 comprising an annular recessed basin between the perimeter of the flange and the outside of the body.

* * * * *